(12) United States Patent
Inoue et al.

(10) Patent No.: US 9,034,487 B2
(45) Date of Patent: May 19, 2015

(54) LIGHT-EMITTING ELEMENT MATERIAL, LIGHT-EMITTING ELEMENT, ELECTRONIC DEVICE, AND LIGHTING DEVICE

(75) Inventors: Hideko Inoue, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 702 days.

(21) Appl. No.: 13/302,708

(22) Filed: Nov. 22, 2011

(65) Prior Publication Data
US 2012/0126211 A1    May 24, 2012

(30) Foreign Application Priority Data
Nov. 24, 2010    (JP) ................. 2010-260931

(51) Int. Cl.
| | | |
|---|---|---|
| H01L 51/54 | (2006.01) | |
| H05B 33/14 | (2006.01) | |
| H01L 51/00 | (2006.01) | |
| C09K 11/06 | (2006.01) | |
| H01L 51/50 | (2006.01) | |

(52) U.S. Cl.
CPC ............ *H01L 51/0085* (2013.01); *H05B 33/14* (2013.01); *H01L 51/5032* (2013.01); *C09K 11/06* (2013.01); *C09K 2211/1029* (2013.01); *C09K 2211/185* (2013.01); *H01L 51/5016* (2013.01); *H01L 51/5024* (2013.01); *Y10S 428/917* (2013.01)

(58) Field of Classification Search
CPC . H01L 51/5032; C07D 213/02; C07D 213/04
See application file for complete search history.

(56) References Cited

U.S. PATENT DOCUMENTS

| | | |
|---|---|---|
| 6,998,492 B2 | 2/2006 | Seo et al. |
| 7,314,769 B2 | 1/2008 | Seo et al. |
| 2002/0047551 A1* | 4/2002 | Rubner et al. ............ 315/169.2 |
| 2002/0079830 A1* | 6/2002 | Brunner et al. ............ 313/498 |
| 2011/0112296 A1 | 5/2011 | Thompson et al. |
| 2012/0126210 A1 | 5/2012 | Inoue et al. |

FOREIGN PATENT DOCUMENTS

| | | |
|---|---|---|
| JP | 2005-2101 | 1/2005 |
| WO | WO 2010/115848 A1 | 10/2010 |

OTHER PUBLICATIONS

Machine translation of WO 2010/115848 A1 (Oct. 2010).*
Lees, A.J., "Luminescence Properties of Organometallic Complexes," Chem. Rev., vol. 87, issue 4, Aug. 1, 1987, pp. 711-743.
Lee, J.-K. et al, "Synthesis and Characterization of an Electroluminescent Polyester Containing the Ru(II) Complex," Chem. Mater., vol. 9, No. 8, Aug. 1, 1997, pp. 1710-1712.
Ademi et al., "Diastereoselective formation of a complex with an atropisomeric 4,4'-biquinazoline ligand: The solid-state structure of *cis*-bis(4,4'-biquinazoline)dichloridoiridium(III) hexafluoridophosphate,", *Inorganic Chemistry Communications*, Feb. 20, 2008, vol. 11, No. 5, pp. 564-567, Elsevier Science Direct.

* cited by examiner

*Primary Examiner* — Marie R. Yamnitzky
(74) *Attorney, Agent, or Firm* — Husch Blackwell LLP (57) ABSTRACT

A light-emitting element material including an ionic iridium complex in which a 2,6-bis(2-picolinyl)pyridine structure is coordinated to iridium is provided. Alternatively, a light-emitting element material including an ionic iridium complex represented by the following structural formula (1) is provided. In addition, a light-emitting element including the light-emitting element material is provided.

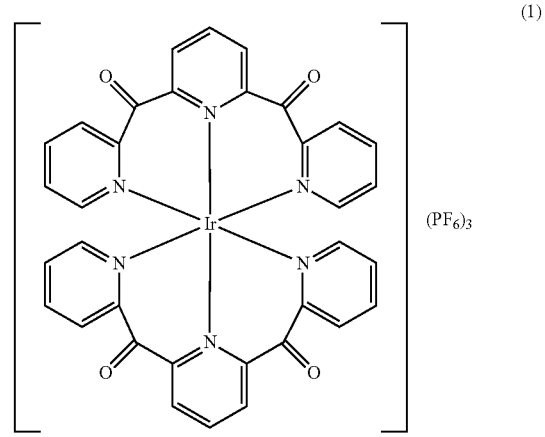

(1)

12 Claims, 6 Drawing Sheets

LIGHT-EMITTING ELEMENT MATERIAL, LIGHT-EMITTING ELEMENT, ELECTRONIC DEVICE, AND LIGHTING DEVICE

BACKGROUND OF THE INVENTION

1. Field of the Invention

An embodiment of the present invention relates to a light-emitting element material, and a light-emitting element, a light-emitting device, an electronic device, and a lighting device including the material.

2. Description of the Related Art

In recent years, research and development have been extensively conducted on light-emitting elements. For example, in one of basic structures of light-emitting elements utilizing electroluminescence (EL), a layer containing a light-emitting substance is interposed between a pair of electrodes. By applying voltage to this element, light emission from the light-emitting substance can be obtained.

In order to improve element characteristics of such light-emitting elements, improvement of an element structure, development of a material, and the like have been extensively carried out (for example, Patent Document 1). For example, Patent Document 1 discloses a light-emitting element material including an organic compound capable of converting triplet excitation energy into light to achieve high-luminance emission or high emission efficiency.

[Reference]
[Patent Document 1] Japanese Published Patent Application No. 2005-2101

SUMMARY OF THE INVENTION

It is an object of one embodiment of the present invention to provide a novel light-emitting element material capable of converting triplet excitation energy into light. In addition, it is an object to provide a light-emitting element including the novel light-emitting element material.

One embodiment of the present invention is a light-emitting element material including an ionic iridium complex in which a 2,6-bis(2-picolinyl)pyridine structure is coordinated to iridium.

Another embodiment of the present invention is a light-emitting element material including an ionic iridium complex represented by the following structural formula (1).

(1)

Another embodiment of the present invention is a light-emitting element including the aforementioned light-emitting element material.

Another embodiment of the present invention is a light-emitting device including the aforementioned light-emitting element material.

Another embodiment of the present invention is an electronic device including the aforementioned light-emitting element material.

Another embodiment of the present invention is a lighting device including the aforementioned light-emitting element material.

Note that the light-emitting device in this specification includes an image display device and a light source. In addition, the light-emitting device includes all the following modules: a module in which a connector, such as a flexible printed circuit (FPC), a tape automated bonding (TAB) tape, or a tape carrier package (TCP), is attached to a panel; a module in which a printed wiring board is provided at the end of a TAB tape or a TCP; and a module in which an integrated circuit (IC) is directly mounted on a light-emitting device by a chip-on-glass (COG) method.

A novel light-emitting element material capable of converting triplet excitation energy into light can be provided. In addition, a light-emitting element including the novel light-emitting element material can be provided.

DETAILED DESCRIPTION OF THE INVENTION

Embodiments of the present invention will be described below with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

(Embodiment 1)

In this embodiment, a light-emitting element material of one embodiment of the present invention and a light-emitting element including the material will be described. In this embodiment, a light-emitting element is described which includes a pair of electrodes and a light-emitting layer between the pair of electrodes and which emits electroluminescent light. Note that the light-emitting element material of one embodiment of the present invention can also be applied to a light-emitting element which emits chemiluminescent light.

Figure 1A:
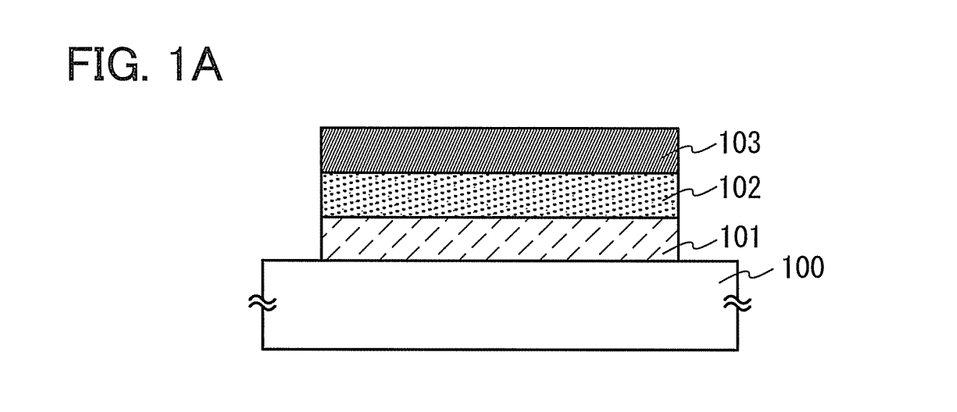
FIGS. 1A and 1B each illustrate a light-emitting element of one embodiment of the present invention.

In a light-emitting element of this embodiment illustrated in FIG. 1A, a light-emitting layer 102 is provided between a pair of electrodes, i.e., a first electrode 101 and a second electrode 103. Note that in the light-emitting element described in this embodiment, the first electrode 101 provided over a substrate 100 functions as an anode and the second electrode 103 functions as a cathode.

The substrate 100 is used as a support of the light-emitting element. For the substrate 100, for example, glass, quartz, plastic, or the like can be used. A flexible substrate can also be used. The flexible substrate is a substrate that can be bent, such as a plastic substrate made of polycarbonate, polyarylate, or polyethersulfone, for example. A film made of polypropylene, polyester, polyvinyl fluoride, polyvinyl chloride, or the like, an inorganic film formed by evaporation, or the like can also be used. Note that materials other than these can be used as long as they can function as a support in a manufacturing process of the light-emitting element.

For the first electrode 101, any of metals, alloys, conductive compounds, mixtures thereof, and the like which have a high work function (specifically, a work function of 4.0 eV or more) is preferably used. Specific examples thereof include indium oxide-tin oxide (ITO: indium tin oxide), indium oxide-tin oxide containing silicon or silicon oxide, indium oxide-zinc oxide, indium oxide containing tungsten oxide and zinc oxide, graphene, and the like. Films of these conductive metal oxides are usually formed by a sputtering method, but may be formed by application of a sol-gel method or the like. For example, a film of indium oxide-zinc oxide can be formed by a sputtering method using a target in which zinc oxide is added to indium oxide at 1 wt % to 20 wt %. Further, a film of indium oxide containing tungsten oxide and zinc oxide can be formed by a sputtering method using a target in which tungsten oxide is added to indium oxide at 0.5 wt % to 5 wt % and zinc oxide is added to indium oxide at 0.1 wt % to 1 wt %. Other examples are gold, platinum, nickel, tungsten, chromium, molybdenum, iron, cobalt, copper, palladium, nitrides of metal materials (e.g., titanium nitride), and the like.

The light-emitting layer 102 is formed over the first electrode 101, using at least a light-emitting element material including an ionic iridium complex in which a 2,6-bis(2-picolinyl)pyridine structure is coordinated to iridium. More specifically, the light-emitting layer 102 is formed using a light-emitting element material including an ionic iridium complex represented by the following structural formula (1).

Note that in the light-emitting layer 102 of the light-emitting element of one embodiment of the present invention, the aforementioned light-emitting element material may be included as a single layer or may be dispersed as a guest material in a known host material. Alternatively, the aforementioned light-emitting element material can be dispersed in a solvent. Note that plural kinds of host materials can be used for the light-emitting layer 102.

With a structure in which a guest material is dispersed in a host material, crystallization of the light-emitting layer 102 can be suppressed. In addition, concentration quenching due to high concentration of the guest material can be suppressed.

The light-emitting layer 102 is preferably formed by a wet method. Film formation by a wet method is performed by applying a composition including the aforementioned light-emitting element material, a host material, and a solvent. The composition may contain another organic material. The composition may further contain a binder in order to improve quality of a film to be formed. For the binder, a high molecular compound that is electrically inactive is preferably used. Specifically, polymethylmethacrylate (abbreviation: PMMA), polyimide, or the like can be used.

As a method for forming a film using the composition, any of the following methods can be employed: a spin coating method, a roll coating method, a spray method, a casting method, a dipping method, a droplet discharge (jet) method (an inkjet method), a dispensing method, a variety of printing methods (a method by which a film can be formed in a desired pattern, such as screen printing (mimeographing), offset (planographic) printing, relief printing, or gravure (intaglio) printing), and the like. Note that another method may be employed as long as the film can be formed by the method using a liquid composition. Note that a film formed in this specification by a wet method is extremely thin in some cases depending on its formation conditions, and the film does not necessarily maintain the form of a film; for example, it may include a discontinuous island structure or the like.

In the case of forming the light-emitting layer 102 by a wet method, the film formation can be performed under the atmospheric pressure, and facilities necessary for a vacuum apparatus and the like can be reduced. In addition, since a vacuum apparatus does not necessarily need to be used, the size of a substrate that is to be processed is not restricted by the size of a vacuum chamber and an increase in substrate size can be dealt with. From the aspect of process temperature, heat treatment is necessary only at temperatures of such a degree that the solvent in the composition is removed. Therefore, even substrates and materials which would be decomposed, altered, or deformed through high-temperature heat treatment can be used.

Furthermore, since a liquid composition having fluidity is used for the film formation, mixture of materials is easy. In addition, good coverage with respect to a region where the film is formed can also be achieved.

The light-emitting layer 102 may have a film shape or may be a liquid composition having fluidity. In the case of a liquid composition having fluidity, a sealed cell in which the first electrode 101 and the second electrode 103 are provided may be filled with the composition.

When the second electrode 103 functions as a cathode, any of metals, alloys, conductive compounds, mixtures thereof, and the like which have a low work function (preferably, a work function of 3.8 eV or less) is preferably used for the second electrode 103. Specific examples thereof include elements that belong to Groups 1 and 2 in the periodic table, that is, alkali metals such as lithium and cesium, alkaline earth metals such as magnesium, calcium, and strontium, alloys thereof (e.g., Mg—Ag and Al—Li), rare-earth metals such as europium and ytterbium, alloys thereof, aluminum, silver, and the like.

Note that when the second electrode 103 is formed, a vacuum evaporation method or a sputtering method can be used. In the case of using a silver paste or the like, a coating method, an inkjet method, or the like can be used.

In the above-described light-emitting element, a current flows due to a potential difference generated between the first electrode 101 and the second electrode 103 and holes and electrons recombine in the light-emitting layer 102, so that light is emitted. Then, this light emission is extracted to the outside through either the first electrode 101 or the second electrode 103 or both. Therefore, either the first electrode 101 or the second electrode 103, or both, is an electrode having a property of transmitting visible light.

Note that the structure of layers provided between the first electrode 101 and the second electrode 103 is not limited to the above-described structure. In addition to the light-emitting layer 102, functional layers may be provided.

Note that the light-emitting layer 102 may have a structure in which two or more layers are stacked. In that case, at least one of the layers should include the light-emitting element material of one embodiment of the present invention. Note that in the case where the light-emitting layer 102 has a structure in which two or more layers are stacked, the stacked layers may emit light of the same color or different colors. Furthermore, a layer containing a fluorescent compound as a light-emitting substance and a layer containing a phosphorescent compound as a light-emitting substance can be stacked.

Figure 1B:
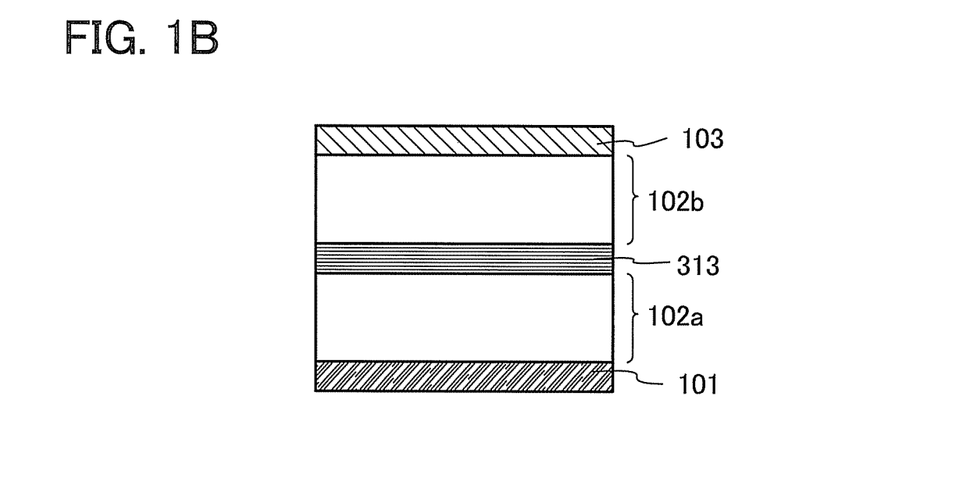

Moreover, in the case where a plurality of light-emitting layers is stacked, as illustrated in FIG. 1B, a charge-generation layer 313 may be provided between a first light-emitting layer 102a and a second light-emitting layer 102b.

The charge-generation layer 313 has a function to inject electrons into one of the light-emitting layers and inject holes into the other of the light-emitting layers when a voltage is applied between the first electrode 101 and the second electrode 103. In the case of this embodiment, when a voltage is applied so that the potential of the first electrode 101 becomes higher than that of the second electrode 103, the charge-generation layer 313 injects electrons into the first light-emitting layer 102a and injects holes into the second light-emitting layer 102b.

Note that the charge-generation layer 313 preferably has a property of transmitting visible light in terms of light extraction efficiency. Further, the charge-generation layer 313 functions even if it has lower conductivity than the first electrode 101 or the second electrode 103.

The charge-generation layer 313 may have a structure which includes an organic compound having a high hole-transport property and an electron acceptor (an acceptor) or a structure which includes an organic compound having a high electron-transport property and an electron donor (a donor), or may be a stack of both of these structures. Note that the electron acceptor or the electron donor is at least capable of providing or receiving electrons with the assistance of an electric field.

In the case where the electron acceptor is added to the organic compound having a high hole-transport property, examples of the organic compound having a high hole-transport property which can be used are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB) and the like.

Examples of the electron acceptor are 7,7,8,8-tetracyano-2,3,5,6-tetrafluoroquinodimethane (abbreviation: $F_4$-TCNQ), chloranil, oxides of transition metals, and oxides of metals that belong to Groups 4 to 8 in the periodic table, and the like. Specifically, vanadium oxide, niobium oxide, tantalum oxide, chromium oxide, molybdenum oxide, tungsten oxide, manganese oxide, and rhenium oxide are preferable because of their high electron-acceptor property. Among these, molybdenum oxide is especially preferable since it is stable in the air, has low hygroscopic property, and is easy to handle.

On the other hand, in the case where the electron donor is added to the organic compound having a high electron-transport property, examples of the organic compound having a high electron-transport property which can be used are metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), and bis(2-methyl-8-quinolinolato)(4-phenylphenolato)aluminum(III) (abbreviation: BAlq) and the like. Other examples are metal complexes having an oxazole-based or thiazole-based ligand, such as bis[2-(2-benzoxazolyl)phenolato]zinc(II) (abbreviation: $Zn(BOX)_2$) and bis[2-(2-benzothiazolyl)phenolato]zinc(II) (abbreviation: $Zn(BTZ)_2$). Other than metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used.

Examples of the electron donor which can be used are alkali metals, alkaline earth metals, rare earth metals, metals that belong to Group 13 in the periodic table, and oxides or carbonates thereof. Specifically, lithium, cesium, magnesium, calcium, ytterbium, indium, lithium oxide, cesium carbonate, and the like are preferable. An organic compound, such as tetrathianaphthacene, may be used as the electron donor.

As for a light-emitting element having such a structure, problems such as energy transfer and quenching hardly occur, and a light-emitting element which has both high emission efficiency and a long lifetime can be easily obtained due to a wider choice of materials. In addition, it is possible to suppress an increase in drive voltage which is caused when light-emitting layers are stacked. In addition, a voltage drop due to resistance of an electrode material can be reduced, whereby uniform light emission over a large area is possible.

As described above, the light-emitting element material including an ionic iridium complex in which a 2,6-bis(2-picolinyl)pyridine structure is coordinated to iridium can be provided as a novel light-emitting element material. In addition, a light-emitting element can be manufactured using the light-emitting element material including an ionic iridium complex in which a 2,6-bis(2-picolinyl)pyridine structure is coordinated to iridium.

In addition, by use of a light-emitting element described in this embodiment, a passive matrix light-emitting device or an active matrix light-emitting device in which driving of the light-emitting element is controlled by a transistor can be manufactured.

This embodiment can be implemented in appropriate combination with any of the other embodiments.

(Embodiment 2)

In this embodiment, a light-emitting device of one embodiment of the present invention will be described with reference to FIGS. 2A and 2B. Note that FIG. 2A is a top view illustrating the light-emitting device, and FIG. 2B is a cross-sectional view taken along lines A-B and C-D of FIG. 2A.

Figure 2A:
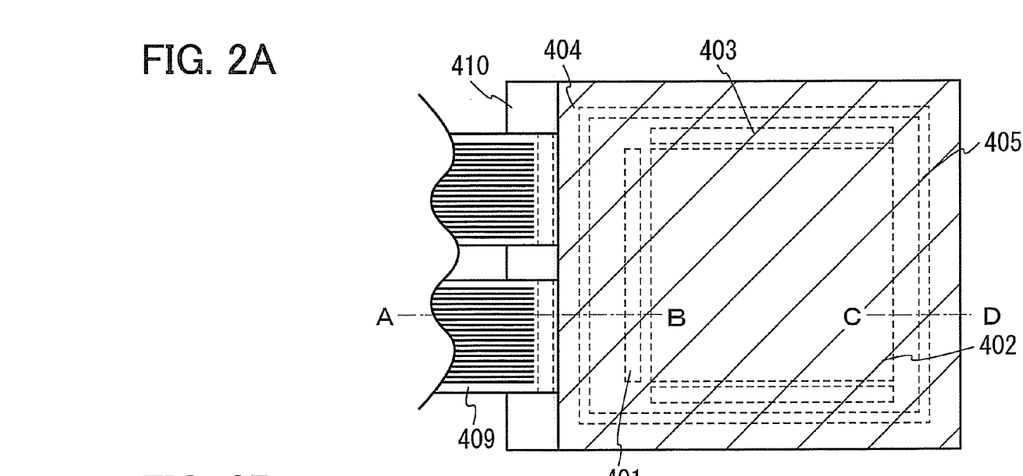
FIGS. 2A and 2B illustrate a light-emitting device of one embodiment of the present invention.
Figure 2B:
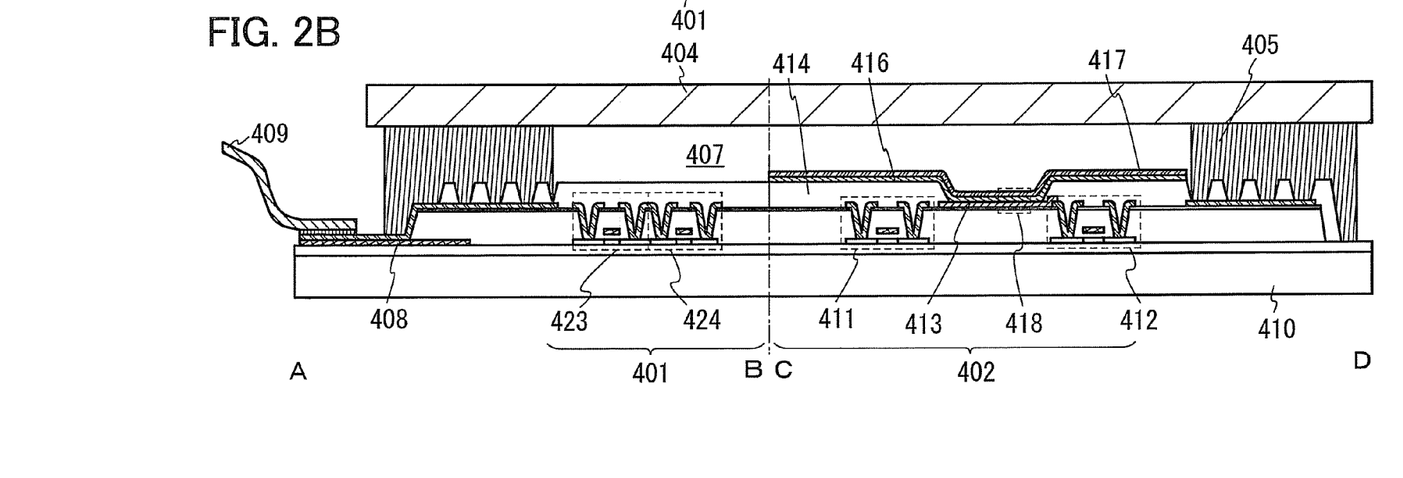

In FIG. 2A, reference numeral 401 denotes a driver circuit portion (a source side driver circuit), reference numeral 402 denotes a pixel portion, and reference numeral 403 denotes a driver circuit portion (a gate side driver circuit), which are indicated by dotted lines. Reference numeral 404 denotes a sealing substrate, reference numeral 405 denotes a sealing material, and a portion enclosed by the sealing material 405 is a space 407.

Note that a lead wiring 408 is a wiring for transmitting signals that are to be input to the source side driver circuit 401 and the gate side driver circuit 403, and receives a video signal, a clock signal, a start signal, a reset signal, and the like from a flexible printed circuit (FPC) 409 which serves as an external input terminal. Although only the FPC is illustrated here, a printed wiring board (PWB) may be attached to the FPC. The light-emitting device in this specification includes not only a light-emitting device itself but also a light-emitting device to which an FPC or a PWB is attached.

Next, a cross-sectional structure will be described with reference to FIG. 2B. The driver circuit portion and the pixel portion are formed over an element substrate 410. Here, the source side driver circuit 401 which is the driver circuit portion and one pixel in the pixel portion 402 are illustrated.

Note that in the source side driver circuit 401, a CMOS circuit which includes an n-channel TFT 423 and a p-channel TFT 424 is formed. The driver circuit may include any of a variety of circuits formed with TFTs, such as a CMOS circuit, a PMOS circuit, or an NMOS circuit. Although a driver-integrated type in which a driver circuit is formed over the substrate is described in this embodiment, the present invention is not limited to this type, and the driver circuit can be formed outside the substrate.

The pixel portion 402 includes a plurality of pixels having a switching TFT 411, a current control TFT 412, and a first electrode 413 electrically connected to a drain of the current control TFT 412. Note that an insulator 414 is formed to cover an end portion of the first electrode 413. Here, the insulator 414 is formed by using a positive type photosensitive acrylic resin film.

In order to improve coverage, the insulator 414 is provided such that either an upper end portion or a lower end portion of the insulator 414 has a curved surface with a curvature. For example, when positive photosensitive acrylic is used as a material for the insulator 414, it is preferable that only an upper end portion of the insulator 414 have a curved surface with a radius of curvature (0.2 μm to 3 μm). For the insulator 414, it is also possible to use either a negative type that becomes insoluble in an etchant by light irradiation or a positive type that becomes soluble in an etchant by light irradiation.

A light-emitting layer 416 and a second electrode 417 are formed over the first electrode 413. The first electrode 413, the light-emitting layer 416, and the second electrode 417 can be formed using the respective materials described in Embodiment 1. Note that the light-emitting layer 416 includes at least a light-emitting element material of one embodiment of the present invention. In this embodiment, the first electrode 413 functions as an anode and the second electrode 417 functions as a cathode.

Further, the sealing substrate 404 is attached to the element substrate 410 with the sealing material 405, so that a light-emitting element 418 is provided in the space 407 enclosed by the element substrate 410, the sealing substrate 404, and the sealing material 405. Note that the space 407 is filled with a filler and may be filled with an inert gas (such as nitrogen or argon) or the sealing material 405.

Note that an epoxy-based resin is preferably used as the sealing material 405. Such a material preferably allows as little moisture and oxygen as possible to penetrate. As a material used for the sealing substrate 404, a glass substrate, a quartz substrate, or a plastic substrate made of fiberglass-reinforced plastics (FRP), polyvinyl fluoride (PVF), polyester, acrylic, or the like can be used.

As described above, the active matrix light-emitting device including the light-emitting element of one embodiment of the present invention can be obtained.

Figure 3A:
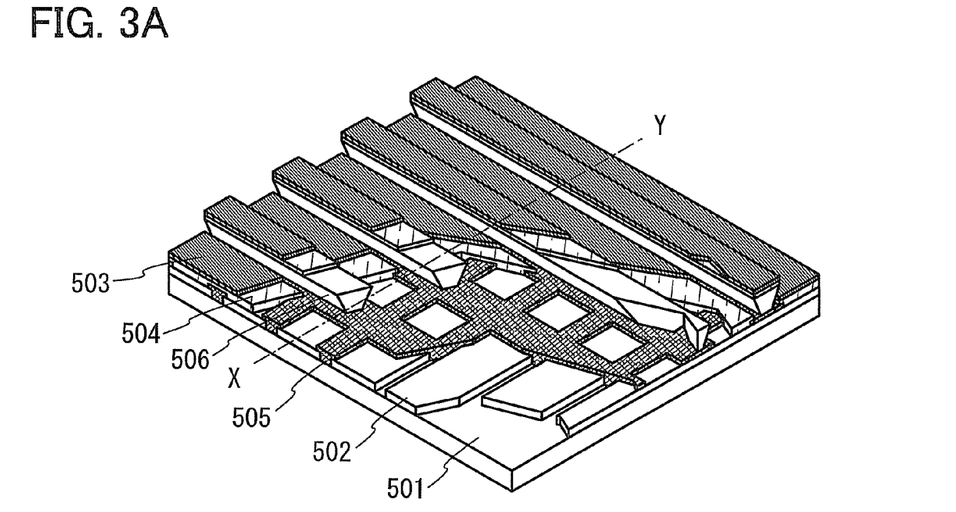
FIGS. 3A and 3B illustrate a light-emitting device of one embodiment of the present invention.
Figure 3B:
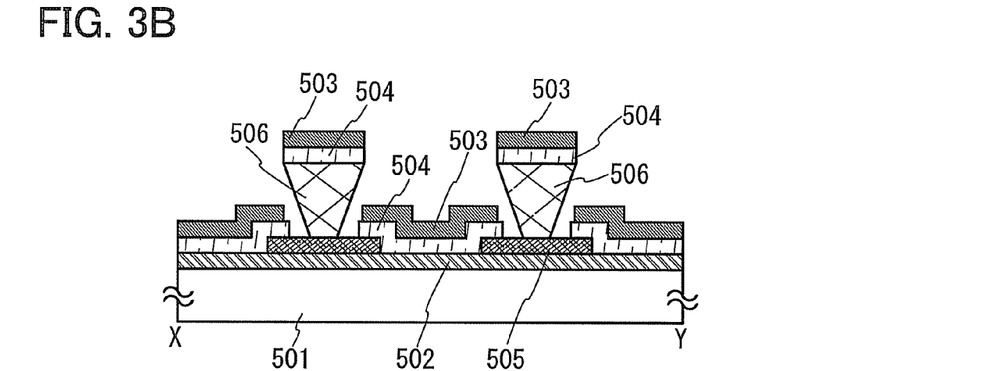

Further, a light-emitting element of the present invention can be used for a passive matrix light-emitting device as well as the above-described active matrix light-emitting device. FIGS. 3A and 3B illustrate a perspective view and a cross-sectional view of a passive matrix light-emitting device including a light-emitting element of one embodiment of the present invention. Note that FIG. 3A is a perspective view of the light-emitting device, and FIG. 3B is a cross-sectional view taken along line X-Y of FIG. 3A.

In FIGS. 3A and 3B, a light-emitting layer 504 is provided between a first electrode 502 and a second electrode 503 over a substrate 501. An end portion of the first electrode 502 is covered with an insulating layer 505. In addition, a partition layer 506 is provided over the insulating layer 505. The sidewalls of the partition layer 506 slope so that a distance between the sidewalls is gradually narrowed toward the surface of the substrate. In other words, a cross section taken along the direction of the short side of the partition layer 506 is trapezoidal, and the lower side (a side parallel to the surface of the substrate 501 and in contact with the insulating layer 505) is shorter than the upper side (a side parallel to the surface of the substrate 501 and not in contact with the insulating layer 505). With the partition layer 506 provided in that manner, a defect of a light-emitting element due to crosstalk or the like can be prevented.

Thus, the passive matrix light-emitting device including a light-emitting element of one embodiment of the present invention can be obtained.

Note that the light-emitting devices described in this embodiment (the active matrix light-emitting device and the passive matrix light-emitting device) are each formed using a light-emitting element of one embodiment of the present invention.

Note that this embodiment can be implemented in an appropriate combination with any of the other embodiments.

(Embodiment 3)

In this embodiment, with reference to FIGS. 4A to 4E, FIG. 5, and FIG. 6, description is given of examples of a variety of electronic devices and lighting devices that are each completed by using a light-emitting device which is one embodiment of the present invention.

Examples of electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like. Specific examples of these electronic devices and lighting devices are illustrated in FIGS. 4A to 4E.

Figure 4A:
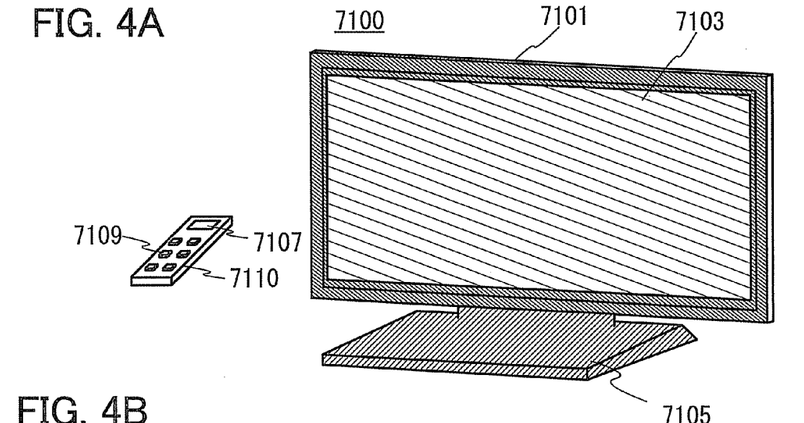
FIGS. 4A to 4E illustrate electronic devices and a lighting device of one embodiment of the present invention.

FIG. 4A illustrates an example of a television device. In a television device 7100, a display portion 7103 is incorporated in a housing 7101. The display portion 7103 is capable of displaying images, and a light-emitting device can be used for the display portion 7103. In addition, here, the housing 7101 is supported by a stand 7105.

The television device 7100 can be operated with an operation switch provided in the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data to be output from the remote controller 7110.

Note that the television device 7100 is provided with a receiver, a modem, and the like. With the receiver, general television broadcasting can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 4B:
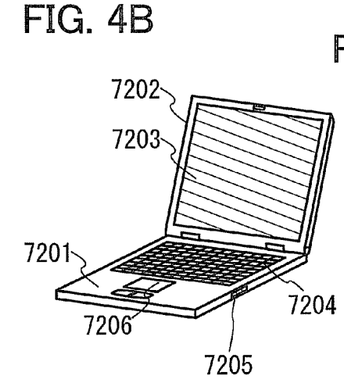

FIG. 4B illustrates a computer, which includes a main body 7201, a housing 7202, a display portion 7203, a keyboard 7204, an external connection port 7205, a pointing device 7206, and the like. Note that this computer is manufactured by using a light-emitting device for the display portion 7203.

Figure 4C:
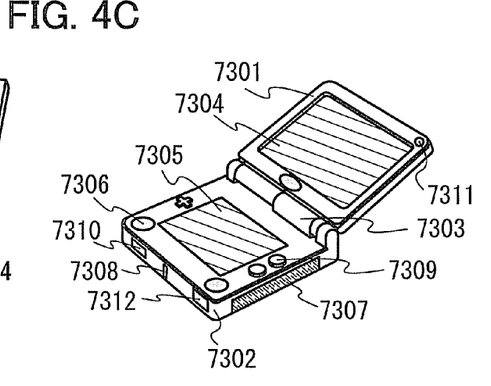

FIG. 4C illustrates a portable game machine, which includes two housings, i.e., a housing 7301 and a housing 7302, connected to each other via a joint portion 7303 so that the portable game machine can be opened or closed. A display portion 7304 is incorporated in the housing 7301 and a display portion 7305 is incorporated in the housing 7302. In addition, the portable game machine illustrated in FIG. 4C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), and a microphone 7312), and the like. It is needless to say that the structure of the portable game machine is not limited to the above structure as long as a light-emitting device is used for at least either the display portion 7304 or the display portion 7305, or both, and may include other accessories as appropriate. The portable game machine illustrated in FIG. 4C has a function of reading out a program or data stored in a storage medium to display it on the display portion, and a function of sharing information with another portable game machine by wireless communication. Note that the portable game machine illustrated in FIG. 4C can have a variety of functions without limitation to those above.

Figure 4D:
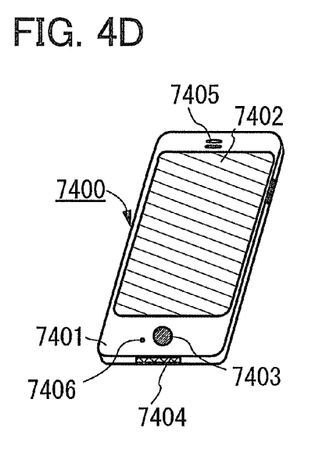

FIG. 4D illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using a light-emitting device for the display portion 7402.

When the display portion 7402 of the cellular phone 7400 illustrated in FIG. 4D is touched with a finger or the like, data can be input to the cellular phone 7400. Further, operations such as making a call and creating e-mail can be performed by touch on the display portion 7402 with a finger or the like.

There are mainly three screen modes for the display portion 7402. The first mode is a display mode mainly for displaying an image. The second mode is an input mode mainly for inputting information such as characters. The third mode is a display-and-input mode in which two modes of the display mode and the input mode are mixed.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are changed by touch on the display portion 7402 or operation with the operation buttons 7403 of the housing 7401. Alternatively, the screen modes can be changed depending on the kind of image displayed on the display portion 7402. For example, when a signal for an image to be displayed on the display portion is data of moving images, the screen mode is changed to the display mode. When the signal is text data, the screen mode is changed to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal identification can be performed. Furthermore, when a backlight or a sensing light source which emits near-infrared light is provided for the display portion, an image of a finger vein, a palm vein, or the like can also be taken.

Figure 4E:
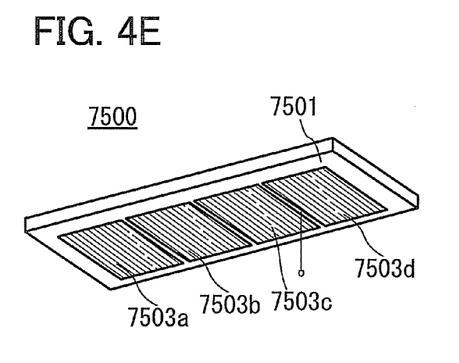

FIG. 4E illustrates an example of a lighting device. In a lighting device 7500, light-emitting devices 7503a to 7503d of one embodiment of the present invention are incorporated in a housing 7501 as light sources. The lighting device 7500 can be attached to a ceiling, a wall, or the like.

The light-emitting device of one embodiment of the present invention includes a light-emitting element in a thin film form. Thus, when the light-emitting device is attached to a base with a curved surface, the light-emitting device with a curved surface can be obtained. In addition, when the light-emitting device is located in a housing with a curved surface, an electronic device or a lighting device with a curved surface can be obtained.

Figure 5:
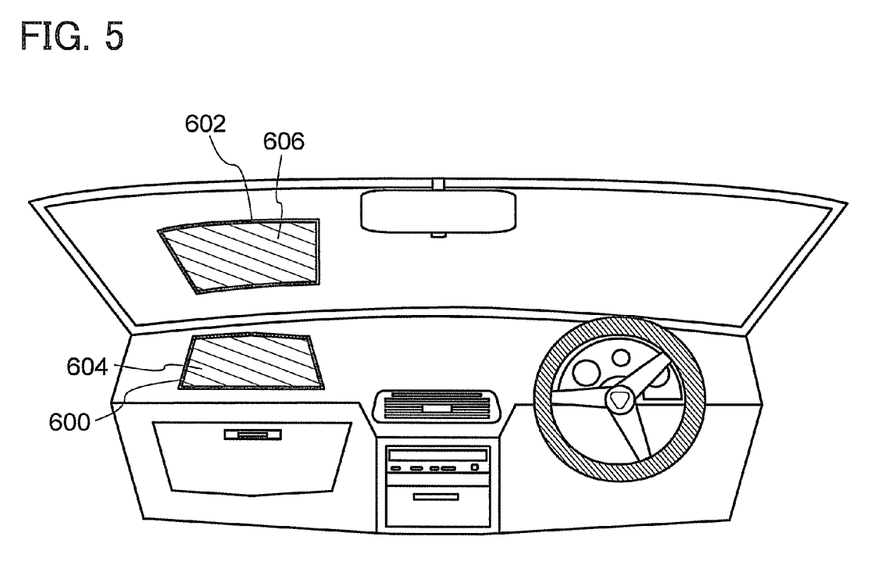
FIG. 5 illustrates an electronic device of one embodiment of the present invention.

FIG. 5 illustrates a driver's seat and the periphery thereof inside a vehicle. FIG. 5 illustrates an example in which a display device 600 is set on a dashboard and a display device 602 is set on a windshield. In the display device 600 illustrated in FIG. 5, a display portion 604 is incorporated in a housing with a curved surface and can display images. In the display device 600, the light-emitting device of one embodiment of the present invention can be used in the display portion 604.

In the display device 602 illustrated in FIG. 5, a display portion 606 is incorporated in a housing with a curved surface and the light-emitting device of one embodiment of the present invention can be used in the display portion 606. A pair of electrodes and a support of a light-emitting element which are included in the light-emitting device of one embodiment of the present invention are formed using a light-transmitting material, whereby light can be extracted to the outside through both a top surface and a bottom surface of the light-emitting device. Thus, when the light-emitting device is used in the display portion 606, the outside can be seen through the display portion 606 on the windshield. Further, an image displayed on the display portion 606 can be seen from the outside through the windshield.

Note that the display device 600 or the display device 602 illustrated in FIG. 5 can also be used as a lighting device.

Figure 6:
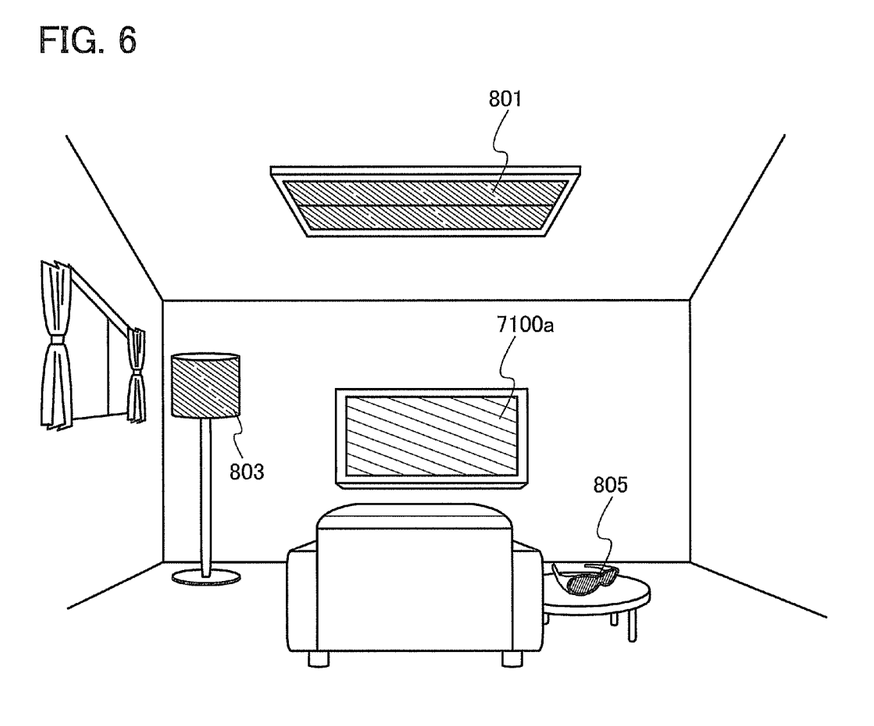
FIG. 6 illustrates electronic devices and lighting devices of one embodiment of the present invention.

FIG. 6 illustrates an example in which a light-emitting device is used for an interior lighting device 801. Since the light-emitting device can have a larger area, it can be used as a lighting device having a large area. In addition, a lighting device 803 in which a light-emitting region has a curved surface can also be obtained with the use of a housing with a curved surface. A light-emitting element included in the lighting device described in this embodiment is in a thin film form, which allows the housing to be designed more freely. Therefore, the lighting device can be elaborately designed in a variety of ways.

A television device 7100a as illustrated in FIG. 4A as an example can be set in a room provided with the lighting device to which one embodiment of the present invention is applied. The television device 7100a may have a three-dimensional display function as well as a normal two-dimensional display function. In FIG. 6, a three-dimensional image can be watched with glasses 805 for watching three-dimensional images.

In the above-described manner, electronic devices or lighting devices can be obtained by application of a light-emitting device. Application range of the light-emitting device is so wide that the light-emitting device can be applied to electronic devices in a variety of fields.

Note that the structure described in this embodiment can be combined with any of the structures described in the above embodiments as appropriate.

This application is based on Japanese Patent Application serial no. 2010-260931 filed with Japan Patent Office on Nov. 24, 2010, the entire contents of which are hereby incorporated by reference.

What is claimed is:

1. A light-emitting element comprising:
a first electrode over a substrate;
a light-emitting layer including a composition over the first electrode; and
a second electrode over the light-emitting layer,
wherein the composition comprises an iridium complex represented by a structural formula (1)

and
wherein the composition is a liquid composition having fluidity.

2. The light-emitting element according to claim 1, wherein the composition is capable of converting triplet excitation energy into light.

3. A light-emitting device comprising the light-emitting element according to claim 1.

4. An electronic device comprising the light-emitting element according to claim 1.

5. A lighting device comprising the light-emitting element according to claim 1.

6. A light-emitting element comprising:
a first electrode over a substrate;
a light-emitting layer including a composition over the first electrode; and
a second electrode over the light-emitting layer,
wherein the composition comprises an iridium complex represented by a structural formula (1)

and
wherein the composition further comprises a host material and a solvent.

7. The light-emitting element according to claim 6, wherein the composition is capable of converting triplet excitation energy into light.

8. The light-emitting element according to claim 6, wherein the composition further comprises a binder.

9. The light-emitting element according to claim 8, wherein the binder is polymethylmethacrylate or polyimide.

10. A light-emitting device comprising the light-emitting element according to claim 6.

11. An electronic device comprising the light-emitting element according to claim 6.

12. A lighting device comprising the light-emitting element according to claim 6.

* * * * *